(12) United States Patent
Bangsaruntip et al.

(10) Patent No.: US 8,445,337 B2
(45) Date of Patent: *May 21, 2013

(54) GENERATION OF MULTIPLE DIAMETER NANOWIRE FIELD EFFECT TRANSISTORS

(75) Inventors: Sarunya Bangsaruntip, Mount Kisco, NY (US); Guy M. Cohen, Mohegan Lake, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 387 days.

This patent is subject to a terminal disclaimer.

(21) Appl. No.: 12/778,517

(22) Filed: May 12, 2010

(65) Prior Publication Data

US 2011/0278543 A1    Nov. 17, 2011

(51) Int. Cl.
*H01L 21/00*    (2006.01)

(52) U.S. Cl.
USPC .... 438/151; 977/762; 977/938; 257/E29.245; 257/E21.404

(58) Field of Classification Search
USPC ... 438/151, 142; 977/762, 938; 257/E29.245, 257/E21.404, 347
See application file for complete search history.

(56) References Cited

U.S. PATENT DOCUMENTS

| | | |
|---|---|---|
| 5,872,378 A | 2/1999 | Rose et al. |
| 6,181,193 B1 | 1/2001 | Coughlin, Jr. |
| 6,207,588 B1 | 3/2001 | Choi et al. |
| 6,340,625 B1 | 1/2002 | Choi et al. |
| 6,362,606 B1 | 3/2002 | Dupuis et al. |
| 6,392,488 B1 | 5/2002 | Dupuis et al. |
| 6,500,728 B1 | 12/2002 | Wang |
| 6,504,418 B1 | 1/2003 | Coughlin, Jr. |
| 6,551,881 B1 | 4/2003 | Letavic |
| 6,656,573 B2 | 12/2003 | Chen et al. |
| 6,724,048 B2 | 4/2004 | Min et al. |
| 6,821,913 B2 | 11/2004 | Chuang et al. |
| 6,916,717 B2 | 7/2005 | Li et al. |
| 6,951,792 B1 | 10/2005 | McElheny et al. |
| 6,970,036 B2 | 11/2005 | Mizuno |
| 7,129,554 B2 | 10/2006 | Lieber et al. |
| 7,161,414 B2 | 1/2007 | Mizuno |
| 7,211,464 B2 | 5/2007 | Lieber et al. |
| 7,224,195 B2 | 5/2007 | Pilling et al. |
| 7,224,232 B2 | 5/2007 | Paul et al. |
| 7,254,151 B2 | 8/2007 | Lieber et al. |
| 7,256,466 B2 | 8/2007 | Lieber et al. |
| 7,416,927 B2 | 8/2008 | Gottsche et al. |
| 7,528,004 B2 | 5/2009 | Torii |

(Continued)

OTHER PUBLICATIONS

U.S. Appl. No. 12/365,623, filed Feb. 4, 2009.

(Continued)

*Primary Examiner* — N Drew Richards
*Assistant Examiner* — Yu-Hsi D Sun
(74) *Attorney, Agent, or Firm* — Cantor Colburn LLP; Vazken Alexanian

(57) ABSTRACT

A method of modifying a wafer having semiconductor disposed on an insulator is provided and includes establishing first and second regions of the wafer with different initial semiconductor thicknesses, forming pairs of semiconductor pads connected via respective nanowire channels at each of the first and second regions and reshaping the nanowire channels into nanowires each having a respective differing thickness reflective of the different initial semiconductor thicknesses at each of the first and second regions.

18 Claims, 4 Drawing Sheets

U.S. PATENT DOCUMENTS

| | | |
|---|---|---|
| 2003/0008505 A1 | 1/2003 | Chen et al. |
| 2004/0180478 A1* | 9/2004 | Yang et al. ............... 438/154 |
| 2007/0122998 A1 | 5/2007 | Droes et al. |
| 2007/0152276 A1 | 7/2007 | Arnold et al. |
| 2008/0061284 A1 | 3/2008 | Chu et al. |
| 2008/0206936 A1 | 8/2008 | Fernandez-Ceballos et al. |
| 2008/0211025 A1 | 9/2008 | Gottsche et al. |
| 2008/0213956 A1 | 9/2008 | Black et al. |
| 2008/0293246 A1 | 11/2008 | Cohen et al. |
| 2011/0278539 A1* | 11/2011 | Bangsaruntip et al. ......... 257/14 |
| 2011/0278544 A1* | 11/2011 | Bangsaruntip et al. ......... 257/24 |
| 2011/0316565 A1 | 12/2011 | Guo et al. |

OTHER PUBLICATIONS

U.S. Appl. No. 12/631,148, filed Dec. 4, 2009.
U.S. Appl. No. 12/778,534, filed May 12, 2010.
U.S. Appl. No. 12/778,526, filed May 12, 2010.

* cited by examiner

GENERATION OF MULTIPLE DIAMETER NANOWIRE FIELD EFFECT TRANSISTORS

CROSS REFERENCE TO RELATED APPLICATIONS

The present application is related to co-pending applications for application Ser. No. 12/778,534 and application Ser. No. 12/778,526 and to U.S. patent application Ser. No. 12/631,148 entitled "Different Thickness Oxide Silicon Nanowire Field Effect Transistors," which was filed at the USPTO on Dec. 4, 2009, the contents of each of which are incorporated herein by reference.

BACKGROUND

Aspects of the present invention are directed to methods of generating of multiple diameter nanowire field effect transistors (FETs).

Nanowire FETs are attracting considerable attention as an option for the design of future complementary-metal-oxide-semiconductor (CMOS) components. While advances are being made, several key issues remain to be considered. Among these, one particular issue is that nanowire FET devices will be required to provide for devices with different drive current strengths and/or different threshold voltages (Vt).

While current solutions to the problem of providing for devices with different drive current strengths and/or different threshold voltages exist, the solutions generally rely upon modulations of device threshold voltages by way of corresponding modulations of the gate work-function. As such, these solutions tend to have relatively difficult and costly process integration operations and, additionally, the solutions tend to present variation concerns.

SUMMARY

In accordance with an aspect of the invention, a method of modifying a wafer having a semiconductor disposed on an insulator is provided and includes establishing first and second regions of the wafer with different initial semiconductor thicknesses, forming pairs of semiconductor pads connected via respective nanowire channels at each of the first and second regions and reshaping the nanowire channels into nanowires each having a respective differing thickness reflective of the different initial semiconductor thicknesses at each of the first and second regions.

In accordance with an aspect of the invention, a method of modifying a wafer having semiconductor disposed on an insulator is provided and includes masking one of first and second regions of the wafer, thinning the semiconductor of the unmasked region such that the first and second regions have different initial semiconductor thicknesses, forming pairs of semiconductor pads connected via respective nanowire channels at the first and second regions and reshaping the nanowire channels into nanowires having thicknesses that are at least as different from one another as a difference between the different initial semiconductor thicknesses.

In accordance with an aspect of the invention, a method of forming a device on a wafer having a silicon-on-insulator (SOI) structure disposed on a buried oxide (BOX) layer is provided and includes establishing first and second regions of the wafer, masking one of the first and second regions, thinning the SOI of the unmasked region such that the first and second regions have different initial SOI thicknesses, forming pairs of SOI pads connected via respective nanowire channels at the first and second regions and reshaping the nanowire channels into nanowires having thicknesses that are at least as different from one another as a difference between the different initial SOI thicknesses.

In accordance with another aspect of the invention, a system is provided and includes a wafer, including a silicon-on-insulator (SOI) structure disposed on a buried oxide (BOX) layer, the wafer having a first region with a first SOI thickness and a second region with a second SOI thickness, the first and second SOI thicknesses being different from one another and sufficiently large such that respective pairs of SOI pads connected via respective nanowires with different thicknesses are formable therein and a mask covering one of the first and second regions, the mask preventing a thickness change of the other of the first and second regions from having effect at the other one of the first and second regions.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

In accordance with aspects of the present invention, nominal, high and low Vt masks are employed to modulate a thickness of an initial silicon on insulator (SOI) structure thickness.

Structures to support, for example, gate-all-around (GAA) nanowire field effect transistors (FETs) as well as methods for fabricating the same are provided by way of descriptions referring to silicon (Si) nanowires and Si processing. However, the present techniques can also be practiced with other semiconductor materials such as, for example, germanium (Ge). When non-Si-containing semiconductors are used, the processing steps of the present teachings are similar and adapted to the specific semiconductor used. Use of Si-containing semiconductor materials such as Si, silicon germanium (SiGe), Si/SiGe, silicon carbide (SiC) or silicon germanium carbide (SiGeC) are therefore understood to be merely exemplary.

Figure 1:
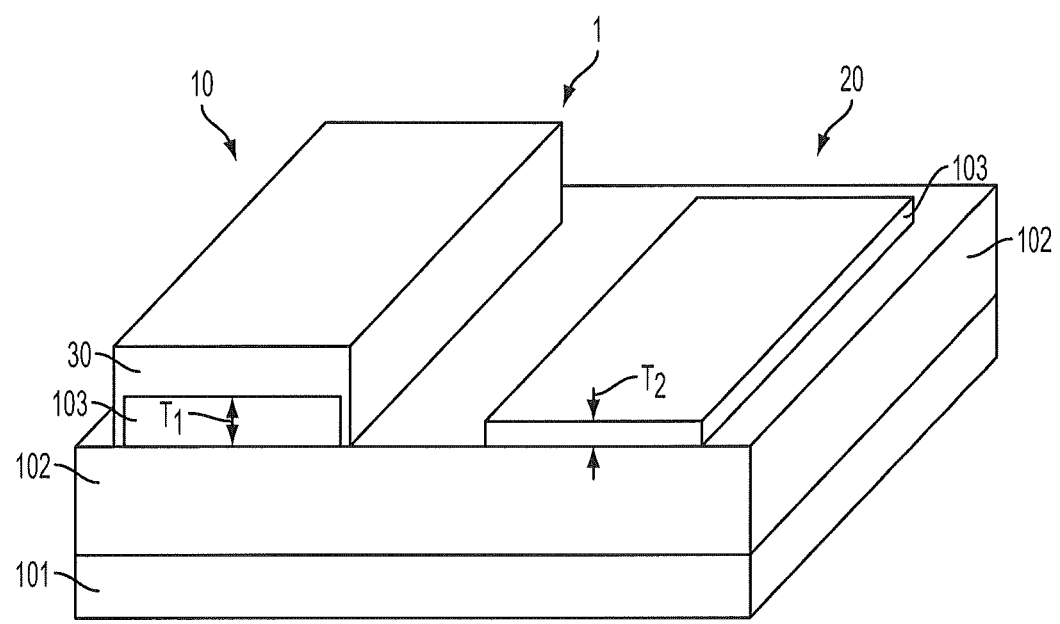
FIG. 1 is a perspective view of a wafer having first and second regions established thereon.

With reference to FIG. 1, a wafer 1 is provided and includes a Si substrate 101, a buried oxide (BOX) layer 102 and a silicon-on-insulator (SOI) layer 103. The wafer 1 can be fabricated using methods such as Separation by IMplanted OXygen (SIMOX) or wafer bonding (for example, Smart-Cut™). These wafer fabrication techniques are known to those of skill in the art and thus are not described further herein. Also, the substitution of other SOI substrates known in the art for the SOI on BOX configuration described herein may be made and would be within the scope of the present teachings.

The wafer 1 has at least a first region 10 and a second region 20 established thereon. The first and second regions 10 and 20 are initially formed of similar components with similar initial silicon thicknesses with the first region 10 being masked by mask 30. Mask 30 covers layer 103 in region 10 and thus prevents any modification of layer 103 in region 10. That is, treatments applied to the surface of wafer 1 may modify layer 103 in region 20 but would not substantially affect layer 103 in region 10 due to the masking by mask 30.

Mask 30 is typically a hard mask, such as silicon nitride ($Si_3N_4$), and the treatment that is applied to the surface of wafer 1 could include, for example, an oxidation or etching. An oxidation would convert the top portion of layer 103 in region 20 to $SiO_2$. Since layer 103 in region 10 is covered with mask 30, however, no substantial oxide forms in or on the layer 103 in region 10. As a result, the silicon portion in layer 103 in region 20 is thinned as compared to that of layer 103 in region 10. Further, when oxidation is used, mask 30 is chosen to be a relatively good oxidation barrier. An example of such masking material is $Si_3N_4$. Etching (wet or dry) can also be used to thin layer 103 in region 20. If etching is used the choice of mask 30 is made to provide relatively good etching resistivity.

With the mask 30 covering first region 10, the SOI layer 103 of the second region 20 can be thinned while the thickness of the SOI layer 103 of the first region 10 remains substantially constant. As a result, the SOI layer 103 of the first region 10 will have an initial silicon thickness $T_1$ and the SOI layer 103 of the second region 20 will have an initial silicon thickness $T_2$ that will be different from and generally thinner than the initial silicon thickness $T_1$ of the first region 10. These differences in the initial silicon thicknesses $T_1$ and $T_2$ may then be manifest in the relative thicknesses of reshaped nanowires 108 to be formed in the first and second regions 10 and 20 (see FIGS. 4 and 6) which will, accordingly, exhibit physical characteristics that may be unique from one another, as will be discussed below.

The thinning of the SOI layer 103 of the second region 20 can be accomplished in one iteration or may be repeated one or more times in order to achieve a selected degree of thinning. The thinning may also be coupled with unmasked thinning of both the first and second regions 10 and 20. Such unmasked thinning can be conducted such that the unmasked thinning of both the first and second regions 10 and 20 occurs at similar rates such that a difference between the thicknesses $T_1$ and $T_2$ is maintained.

An alternative method for fabricating a first SOI region 10 with thickness $T_1$ and a second SOI region 20 with thickness $T_2$ relies on the addition of material to region 10. That is, while the method described above involves subtracting material from region 20 by processes such as oxidation or etching, the alternative method involves the addition of material to the layer 103 at region 10.

As an example, the initial thickness of regions 10 and region 20 may be fixed at $T_2$, which could be the initial thickness of the SOI film 103. A mask similar to mask 30 may then be deposited over region 20. This mask may consist of materials such as $SiO_2$ or $Si_3N_4$. Region 10 remains unmasked. The exposed surface of region 10 is then cleaned (for example stripped of any native oxide) and selective silicon epitaxy is applied to the surface of the wafer 1. In an epitaxial process, silicon is added to layer 103 of region 10. The added silicon mimics the same structure of the layer 103, which serves as a template. As a result, layer 103 in region 10 is thickened, to a thickness $T_1$, and the added silicon has substantially the same crystal structure as that of original layer 103 at region 10.

In accordance with embodiments, the epitaxial growth described above is selective. Here, the selectivity refers to the addition or deposition of silicon only over silicon surfaces but not over dielectric surfaces. As a result, no silicon is deposited over the mask at region 20 or the buried oxide 102. To obtain selective silicon growth, chlorine-containing Si precursors such as silicon-tetrachloride ($SiCl_4$) and dichlorosilane ($H_2SiCl_2$) are frequently used. A mixture of silane ($SiH_4$) and HCL can also be used. The growth temperature depends on the precursor used. For example, when $SiH_4$ is used a growth temperature higher than 500° C. is needed.

Figure 2:
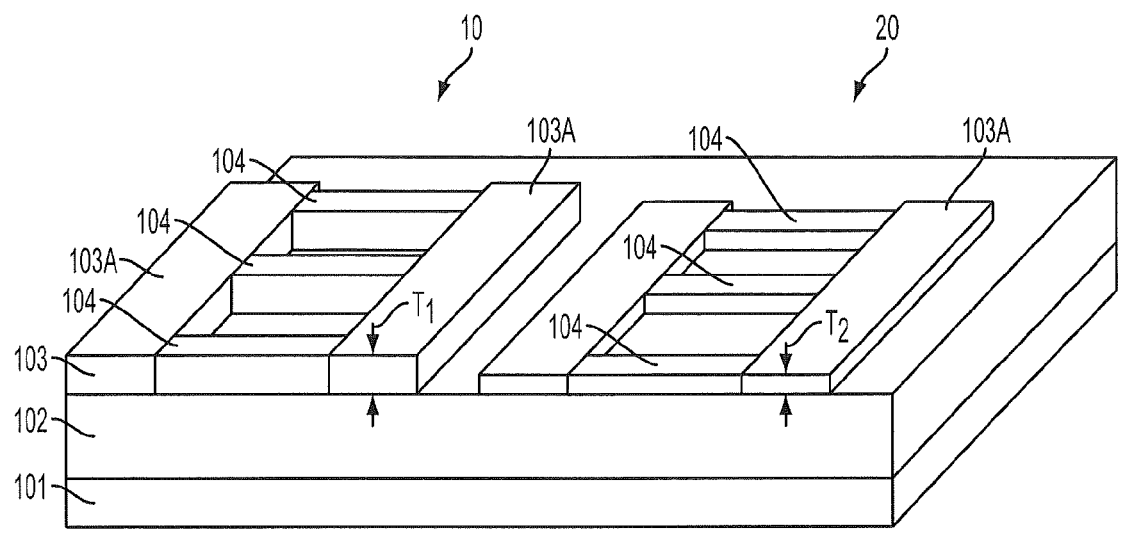
FIG. 2 is a perspective view of the wafer of FIG. 1 having nanowire channels defined thereon.

With reference to FIG. 2, pairs of SOI pads 103A and nanowire channels 104 connecting them can be patterned into the SOI layer 103 at the first region 10 and the second region 20 to form, for example, ladder-like structures in each region having dimensions of or at least reflective of the respective thicknesses $T_1$ and $T_2$. The patterning of the nanowire channels 104 and SOI pads 103A may be achieved by lithography (e.g., optical or e-beam) followed by RIE or by sidewall transfer techniques. These patterning techniques are known to those of skill in the art.

Figure 3:
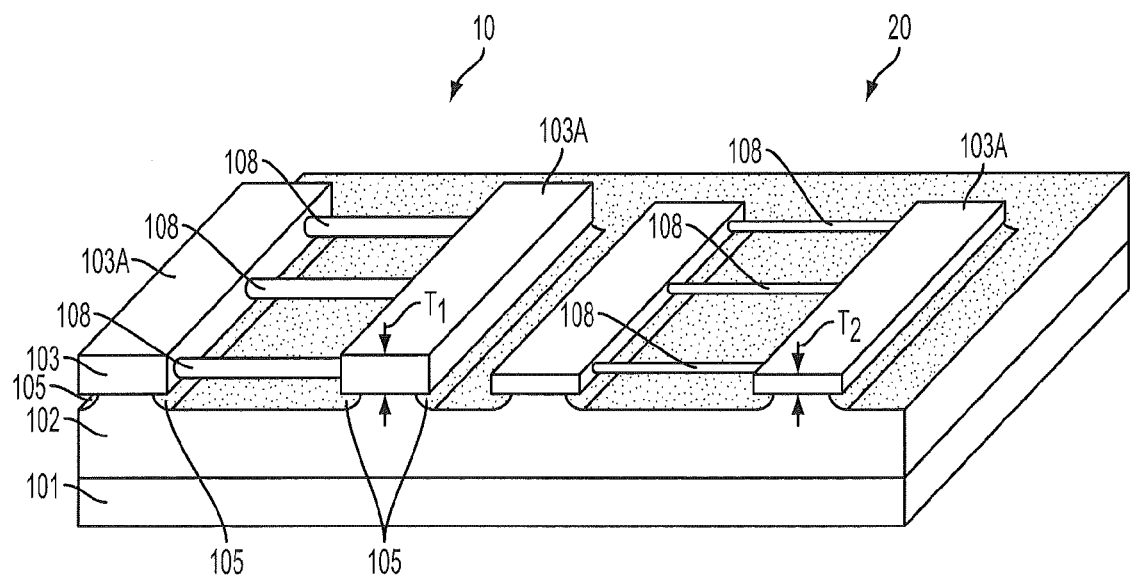
FIGS. 3 and 4 are perspective views of the wafer of FIGS. 1 and 2 having reshaped nanowires defined thereon.
Figure 4:
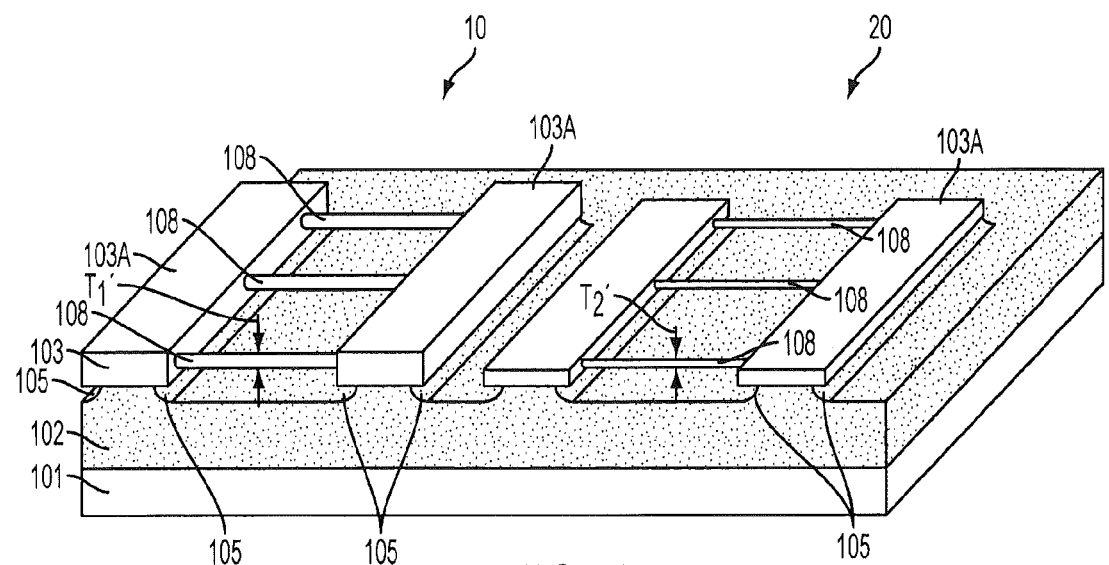

With reference to FIGS. 3 and 4, the nanowire channels 104 can be reshaped into nanowires 108 and suspended or released from the BOX layer 102 by etching and a recessing of the BOX layer 102. The reshaped nanowires 108 thus form suspended bridges between SOI pads 103A and over recessed oxide 105 in the first and second regions 10 and 20. The recessing of the BOX layer 102 can be achieved with a diluted hydrofluoric (DHF) etch. The lateral component of this etching undercuts the BOX layer 102. Alternatively, suspension may be obtained during an annealing process to form the reshapes nanowires 108. While SOI substrates provide an easy path to define and suspend nanowire channels 104 and/or reshaped nanowires 108, it is possible to obtain suspension with other substrates. For example, a SiGe/Si stack epitaxially grown on bulk Si wafers can also be patterned to form the nanowire channels 104 and/or the reshaped nanowires 108. The SiGe layer can also be used as a sacrificial layer (analogous to the BOX layer 102) which is undercut.

As shown in FIG. 3, the reshaped nanowires 108 are formed at the first region 10 with thickness $T_1$ and at the second region 20 with thickness $T_2$. Here, the reshaping refers to a smoothing of the respective surfaces of the reshaped nanowires 108 to thereby change their respective cross-sections to be increasingly cylindrical and thin by the movement of silicon from the bodies of the reshaped nanowires 108 to the SOI pads 103A. As an example, the reshaped nanowires 108 may be formed by way of an annealing during which the wafer 1 contacts an inert gas at a temperature, pressure and for a duration sufficient to cause Si migration.

In particular, the wafer 1 may be annealed in an exemplary $H_2$ gas. Shortly before $H_2$ annealing, native oxide is etched off from the surfaces of the reshaped nanowires 108 and the SOI pads 103A. The annealing in $H_2$ smoothes the nanowire sidewalls, realigns the sidewalls and the SOI pads 103A and re-shapes the nanowire cross-sections from rectangular to cylindrical. The $H_2$ anneal may also thin the bodies of the reshaped nanowires 108 by the Si migration. According to an exemplary embodiment, the inert gas anneal may be performed with a gas pressure of from about 30 torr to about 1000 torr, at a temperature of from about 600 degrees Celsius (° C.) to about 1100° C. and for a duration of about 1-120 minutes. In general, the rate of Si re-distribution increases with temperature and decrease with an increase in pressure.

The reshaped nanowires 108 at the first region 10 and having a thickness $T_1$ and the reshaped nanowires 108 at the second region 20 and having a thickness $T_2$ may have different drive currents and/or threshold voltages. In this way, it is understood that device characteristics at least at the first and second regions 10 and 20 of the wafer 1 can be controlled by corresponding control of initial silicon thicknesses at the first and second regions 10 and 20 which are partially determinative of the thicknesses $T_1$ and $T_2$.

As shown in FIG. 4, the processes for forming the reshaped nanowires 108 at the first and second regions 10 and 20 of the wafer 1 may reshape the nanowires 108 at similar rates or at different unique rates and may be coupled with additional reshaping processes. Thus, differences between final thicknesses $T_{1'}$ and $T_{2'}$ may be similar to the differences between the initial silicon thicknesses $T_1$ and $T_2$ or, alternatively, the differences between thicknesses $T_{1'}$ and $T_{2'}$ may be increased or decreased as compared to the differences between the initial silicon thicknesses $T_1$ and $T_2$. For example, the $H_2$ anneal of at the second thinner region 20 may have a greater relative effect than it does at the first region 10 owing to the relative thinness of the SOI layer 103 at the second region 20. More specifically, it was found experimentally that silicon diffusion is typically faster for smaller nanowires. As a result, the rate of thinning during $H_2$ annealing will be faster for region 20.

Figure 5:
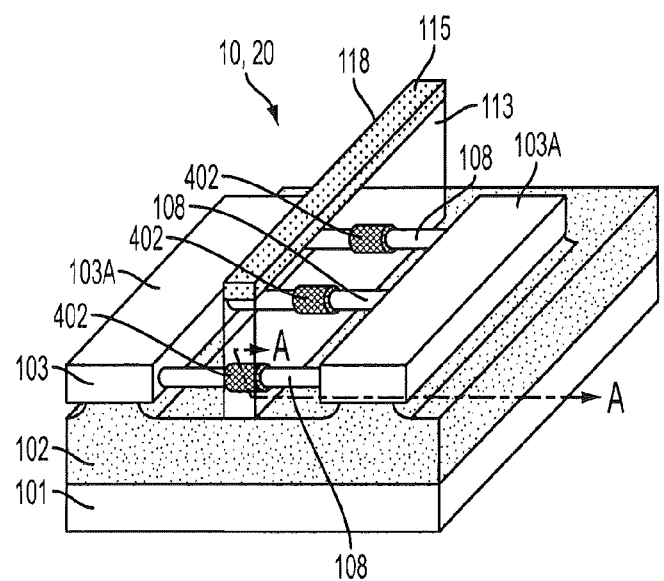
FIG. 5 is a perspective view of a reshaped nanowire having a gate structure.
Figure 6:
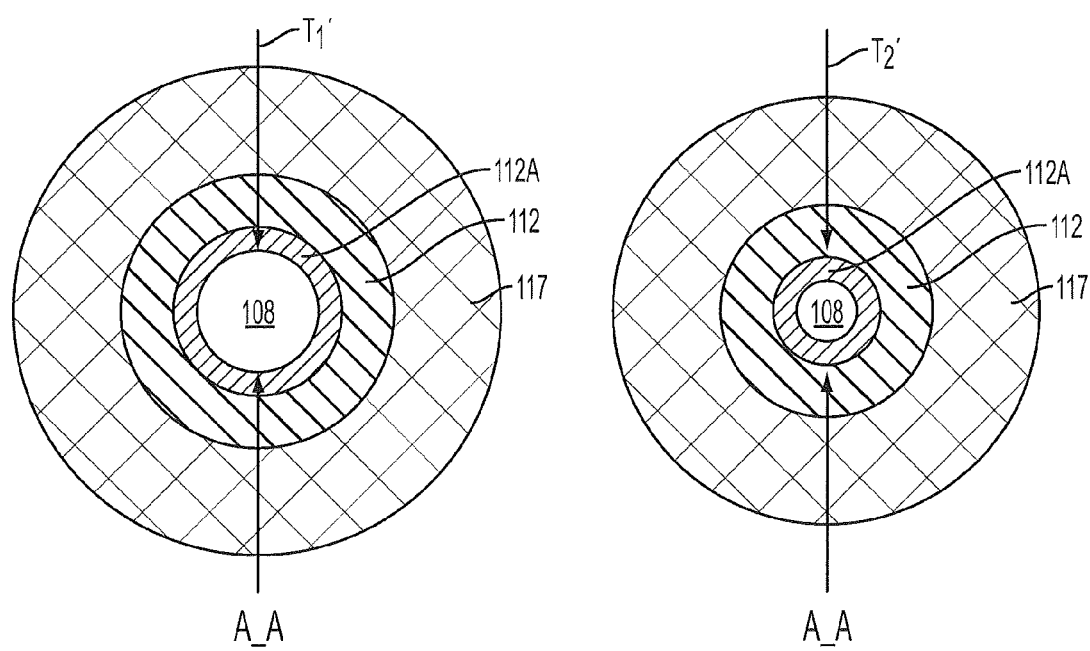
FIG. 6 includes cross-sectional views of nanowires having different thicknesses.

Referring now to FIGS. 5 and 6, a gate structure 402 may be formed around the reshaped nanowires 108. First, the reshaped nanowires 108 are coated with first and second gate dielectrics 112A and 112. The first (and optional) gate dielectric 112A is typically $SiO_2$. The second gate dielectric 112 may include silicon dioxide ($SiO_2$), silicon oxynitride (SiON), hafnium oxide ($HfO_2$) or any other suitable high-K dielectric(s) and may be deposited using chemical vapor deposition (CVD), atomic layer deposition (ALD) or an oxidation furnace in the case of $SiO_2$ and SiON. A conformal deposition of a thin gate conductor 117 of, e.g., TaN or TiN, may then be formed. This may be followed by a deposition of doped poly-Si 113 to form a gate stack 118 perimetrically surrounding the reshaped nanowires 108. A mask 115 is employed to facilitate the etching of a gate line by, for example, RIE. A portion of the thin gate conductor 117 outside of the gate stack 118 may be removed by RIE or, in an alternate embodiment, the removal of the thin gate conductor 117 from surfaces outside gate stack may require an additional wet etch operation.

Poly-germanium or another suitable composition can be used as a substitute to poly-Si 113. Additionally, any poly-SiGe alloy can also be used to substitute poly-Si 113. Still further, poly-Si 113 can be deposited in a poly-crystalline form or deposited in an amorphous form which is later transformed into poly-Si when exposed to high temperature.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A method of modifying a wafer having a semiconductor disposed on an insulator, the method comprising:
    establishing first and second regions of the wafer with different initial semiconductor thicknesses;
    forming pairs of semiconductor pads connected via respective nanowire channels at each of the first and second regions; and
    reshaping the nanowire channels into nanowires each having a respective differing thickness reflective of the different initial semiconductor thicknesses at each of the first and second regions.

2. The method according to claim 1, further comprising forming a respective gate surrounding each of the nanowires.

3. The method according to claim 2, wherein the gates each comprise a dielectric, a thin gate conductor and doped conductive material.

4. The method according to claim 2, wherein the nanowires each have respective drive currents and/or threshold voltages that differ in accordance with the differences between the initial semiconductor thicknesses.

5. The method according to claim 1, wherein the establishing of the first and second regions of the wafer with initial semiconductor thicknesses comprises masking one of the first or the second regions and thinning the unmasked region.

6. The method according to claim 5, wherein the thinning of the unmasked region comprises oxidation.

7. The method according to claim 5, wherein the thinning of the unmasked region is repeated at least once.

8. The method according to claim 1, wherein the establishing of the first and second regions of the wafer with initial semiconductor thicknesses comprises adding semiconductor at one of the first or the second regions.

9. The method according to claim 1, further comprising at least one of unmasked annealing and reducing sizes of each of the nanowires at the first and second regions.

10. The method according to claim 1, wherein the differences between the respective thicknesses are equal to or greater than differences between the initial semiconductor thicknesses.

11. A method of modifying a wafer having semiconductor disposed on an insulator, the method comprising:
    masking one of first and second regions of the wafer;
    thinning the semiconductor of the unmasked region such that the first and second regions have different initial semiconductor thicknesses;
    forming pairs of semiconductor pads connected via respective nanowire channels at the first and second regions; and
    reshaping the nanowire channels into nanowires having thicknesses that are at least as different from one another as a difference between the different initial semiconductor thicknesses.

12. The method according to claim 11, further comprising repeating the thinning at least once.

13. A method of forming a device on a wafer having a silicon-on-insulator (SOI) structure disposed on a buried oxide (BOX) layer, the method comprising:
    establishing first and second regions of the wafer;
    masking one of the first and second regions;
    thinning the SOI of the unmasked region such that the first and second regions have different initial SOT thicknesses;
    forming pairs of SOI pads connected via respective nanowire channels at the first and second regions; and
    reshaping the nanowire channels into nanowires having thicknesses that are at least as different from one another as a difference between the different initial SOI thicknesses.

14. The method according to claim 13, wherein each of the nanowires has a drive current and/or a threshold voltage reflective of the nanowire thickness.

15. The method according to claim 13, further comprising additionally thinning each of the nanowires at a similar rate.

16. The method according to claim 13, further comprising additionally thinning each of the nanowires at a unique rate.

17. The method according to claim 13, further comprising surrounding each of the nanowires with a gate structure.

18. The method according to claim 17, wherein the surrounding of each of the nanowires with the gate structure comprises surrounding each of the nanowires with dielectric material, gate conductive material and doped conductive material.

\* \* \* \* \*